United States Patent
Chen et al.

(10) Patent No.: US 10,498,294 B2
(45) Date of Patent: Dec. 3, 2019

(54) METHOD FOR ENHANCING LINEARITY OF A RECEIVER FRONT-END SYSTEM BY USING A COMMON-MODE FEEDBACK PROCESS AND RECEIVER FRONT-END SYSTEM THEREOF

(71) Applicant: KaiKuTek INC., Taipei (TW)

(72) Inventors: Pang-Ning Chen, Taipei (TW); Chen-Lun Lin, Hsinchu (TW); Ying-Chia Chen, Taoyuan (TW); Wei-Jyun Wang, Kaohsiung (TW); Mike Chun Hung Wang, Taipei (TW)

(73) Assignee: KaiKuTek INC., Taipei (TW)

( * ) Notice: Subject to any disclaimer, the term of this patent is extended or adjusted under 35 U.S.C. 154(b) by 0 days.

(21) Appl. No.: 16/105,990

(22) Filed: Aug. 21, 2018

(65) Prior Publication Data

US 2019/0319589 A1 Oct. 17, 2019

Related U.S. Application Data

(60) Provisional application No. 62/656,999, filed on Apr. 13, 2018.

(51) Int. Cl.
*H03F 1/32* (2006.01)
*H03F 3/19* (2006.01)
*H03F 3/45* (2006.01)
*H04B 1/18* (2006.01)

(52) U.S. Cl.
CPC ............... *H03F 1/32* (2013.01); *H03F 3/19* (2013.01); *H03F 3/45475* (2013.01); *H04B 1/18* (2013.01); *H03F 2200/222* (2013.01); *H03F 2200/451* (2013.01); *H03F 2203/45156* (2013.01); *H03F 2203/45544* (2013.01); *H03F 2203/45631* (2013.01)

(58) Field of Classification Search
CPC .......... H03F 1/32; H03F 3/45475; H03F 3/19; H03F 2200/451; H03F 2203/45544; H03F 2203/45156; H03F 2200/222; H03F 2203/45631; H03F 3/26; H03F 1/26; H03F 2200/541; H03F 2200/534; H04B 1/18

See application file for complete search history.

(56) References Cited

U.S. PATENT DOCUMENTS 6,118,322 A * 9/2000 Bockelman ............... H03F 1/32 327/313
2003/0114129 A1 * 6/2003 Jerng ....................... H04B 1/18 455/323

(Continued)

*Primary Examiner* — Yuwen Pan
*Assistant Examiner* — Fatuma G Sherif
(74) *Attorney, Agent, or Firm* — Winston Hsu

(57) ABSTRACT

A method for enhancing linearity of the receiver front-end system includes receiving a radio frequency signal by an antenna, converting the radio frequency signal to first differential signals by a transformer module, adjusting frequencies of the first differential signals to generate second differential signals by a mixer module, detecting a common signal in order to reduce a common error of the second differential signals, and generating third differential signals according to a reference signal after the common error is reduced from the second differential signals. The first differential signals, the second differential signals, and the third differential signals are unbalanced.

18 Claims, 7 Drawing Sheets

(56) References Cited

U.S. PATENT DOCUMENTS

| | | | |
|---|---|---|---|
| 2006/0001487 A1* | 1/2006 | Petrovic | H03F 1/26 330/149 |
| 2012/0319767 A1* | 12/2012 | Ao Ieong | H03H 11/32 327/552 |
| 2015/0084688 A1* | 3/2015 | Chang | H03H 11/0466 327/555 |
| 2015/0333786 A1* | 11/2015 | Gard | H04B 1/30 375/346 |

* cited by examiner

METHOD FOR ENHANCING LINEARITY OF A RECEIVER FRONT-END SYSTEM BY USING A COMMON-MODE FEEDBACK PROCESS AND RECEIVER FRONT-END SYSTEM THEREOF

CROSS REFERENCE TO RELATED APPLICATIONS

This application claims the benefit of U.S. provisional application No. 62/656,999, filed Apr. 13, 2018.

BACKGROUND OF THE INVENTION

1. Field of the Invention

The present invention illustrates a method for enhancing linearity of a receiver front-end system, and more particularly, the method for enhancing linearity of the receiver front-end system by using a common-mode feedback process.

2. Description of the Prior Art

With advancements of techniques and networks, several radio frequency emitting technologies are applied to wireless communications. In a wireless receiver, an antenna can be regarded as a transducer that converts electromagnetic waves radiated in space to a radio frequency (RF) electric current. Specifically, a transformer is also commonly used in the wireless receiver for performing an unbalanced-to-balanced impedance transformation. For ideal transformer, the RF electric current can be converted to two differential signals for reducing influences of noise and interference. These differential signals can be regarded as two phase offset signals bearing reducible susceptibility noise caused by electromagnetic interference so that the differential signals can provide a satisfactory signal-to-noise ratio.

However, general RF transformers are non-ideal since their inductances are finite and their electromagnetic couplings are also imperfect. Therefore, unexpectable unbalanced effect is introduced to interfere with the differential signals outputted from the transformer. In other words, a common-mode signal of the differential signals is disturbed by an error offset. In an RF front-end system, when the common-mode signal of the differential signals are varied, linearity of the RF front-end system is degraded since the differential signals may be varied or shifted away from an optimal linear operation region of each circuit of the RF front-end system, thereby leading to transmission performance loss.

SUMMARY OF THE INVENTION

In an embodiment of the present invention, a receiver front-end system comprises an antenna, a transformer module, a mixer module, a common-mode feedback module, an amplifier module, and a bias module. The antenna is configured to receive a radio frequency signal. The transformer module is coupled to the antenna and configured to convert the radio frequency signal to first differential signals. The mixer module is coupled to the transformer module and configured to adjust frequencies of the first differential signals in order to generate second differential signals. The common-mode feedback module is coupled to the mixer module and configured to reduce a common error of the second differential signals in order to generate third differential signals according to a reference signal. The amplifier module is coupled to the common-mode feedback module and configured to amplify the third differential signals to generate amplified third differential signals. The bias module is coupled to the amplifier module and the common-mode feedback module and configured to generate the reference signal to the common-mode feedback module according to the amplified third differential signals. The first differential signals, the second differential signals, and the third differential signals are unbalanced. The common signal of the first differential signals is disturbed by the common error. The common signal of the third differential signals approaches to the reference signal.

In another embodiment of the present invention, a method for enhancing linearity of the receiver front-end system comprises receiving a radio frequency signal by an antenna, converting the radio frequency signal to first differential signals by a transformer module, adjusting frequencies of the first differential signals to generate second differential signals by a mixer module, detecting a common signal in order to reduce a common error of the second differential signals, and generating third differential signals according to a reference signal after the common error is reduced from the second differential signals. The first differential signals, the second differential signals, and the third differential signals are unbalanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
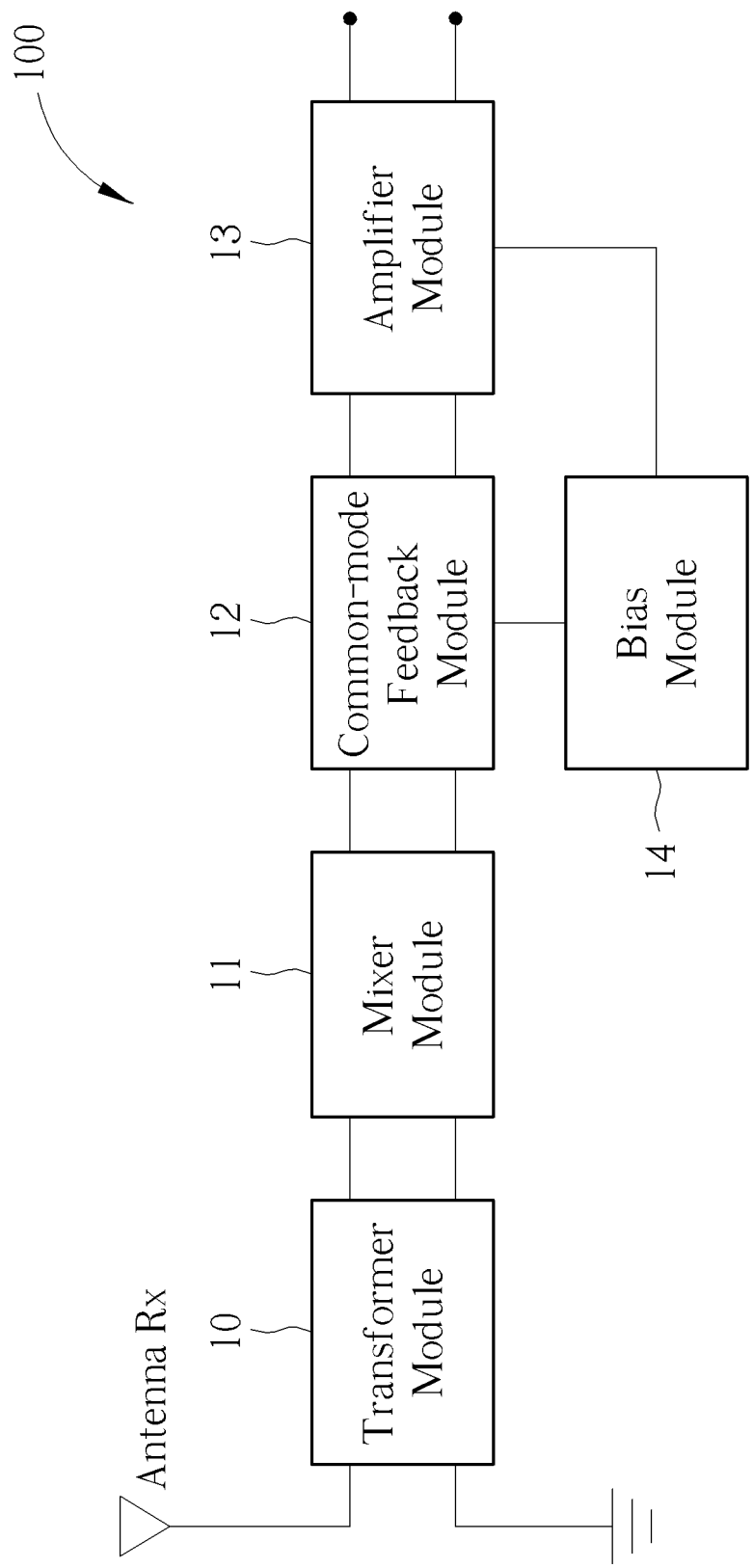
FIG. 1 is a block diagram of a receiver front-end system according to an embodiment of the present invention.

FIG. 1 is a block diagram of a receiver front-end system 100 according to an embodiment of the present invention. The receiver front-end system 100 can be used for receiving any wireless radio frequency signal, such as a microwave or millimeter wave based radio frequency signal with high radio frequencies in an electromagnetic spectrum. The receiver front-end system 100 includes an antenna Rx, a transformer module 10, a mixer module 11, a common-mode feedback module 12, an amplifier module 13, and a bias module 14. The antenna Rx is used for receiving a radio frequency signal. The transformer module 10 is coupled to the antenna Rx for converting the radio frequency signal to first differential signals. In FIG. 1, input signals of the transformer module 10 can be regarded as a pair of unbalanced signals. One input signal of the transformer module 10 is the radio frequency signal received by the antenna Rx. The other input signal of the transformer module 10 is a ground signal. Equivalently, a power gap between the input signals of the transformer module 10 is equal to $X_{RFIN}$. The mixer module 11 is coupled to the transformer module 10 for adjusting frequencies of the first differential signals in order to generate second differential signals. For example, the mixer module 11 can generate second differential signals with a local oscillator frequency, such as around 60 G Hertz. The common-mode feedback module 12 is coupled to the mixer module 11 for reducing a common error of the second differential signals in order to generate third differential signals (i.e., common error eliminated signals) according to a reference signal. The amplifier module 13 is coupled to the common-mode feedback module 12 for amplifying the third differential signals to generate amplified third differential signals. The amplifier module 13 can be a transimpedance amplifier (TIA) module for performing a current-to-voltage amplification operation of the third differential signals in order to output voltage-based differential signals with respect to its amplification factors. However, the amplifier module 13 of the present invention is not limited to the TIA module. Any reasonable hardware modification falls into the scope of the present invention. The bias module 14 is coupled to the amplifier module 13 and the common-mode feedback module 12 for generating the reference signal to the common-mode feedback module 12. The bias module 14 can be regarded as a common-mode reference signal generator for calibrating the "distorted" common signal of the second differential signals to generate a stable and controllable common signal.

In the receiver front-end system 100, the transformer module 10 can be a "non-ideal" transformer module with imperfect couplings. Therefore, unexpectable unbalanced effect is introduced to interfere with the first differential signals outputted from the transformer. In other words, the first differential signals, the second differential signals, and the third differential signals are unbalanced. The common signal of the first differential signals is disturbed by the common error. After a common error elimination process is performed, the common signal of the third differential signals approaches to the reference signal without any common error disturbance. System structures, mathematical models, and mathematical derivations of the common signal of the third differential signals are illustrated later.

Figure 2:
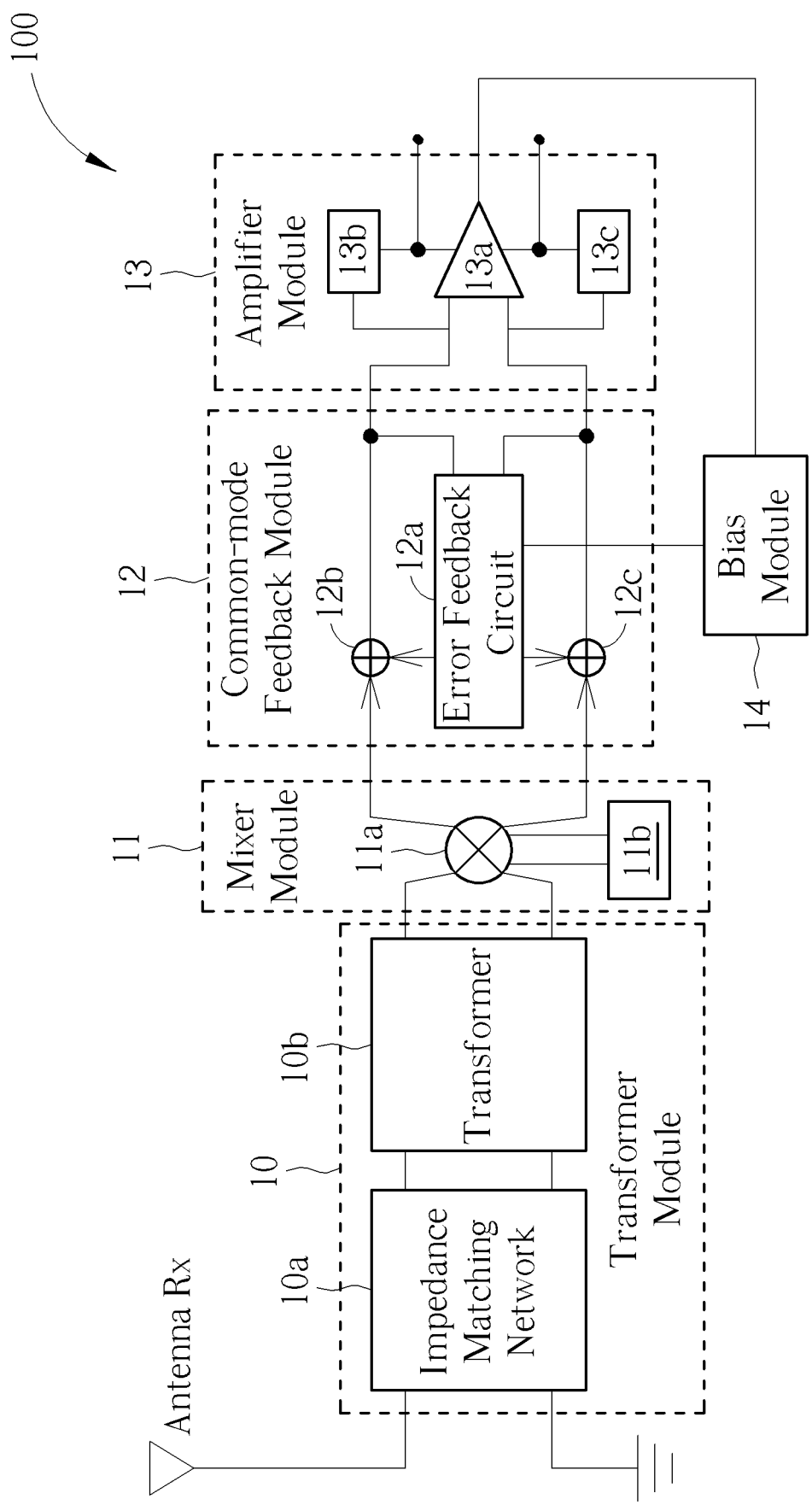
FIG. 2 is a detailed block diagram of the receiver front-end system in FIG. 1.

FIG. 2 is a detailed block diagram of the receiver front-end system 100. The transformer module 10 includes an impedance matching network 10a coupled to the antenna Rx for maximizing power transfer of the radio frequency signal by matching impedance of an equivalent electrical load. For example, the impedance matching network 10a can use 50 ohms for matching impedance in order to minimize signal reflection through a wired electrical load. The transformer module 10 includes a transformer 10b coupled to the impedance matching network 10a for outputting the first differential signals. For example, the transformer module 10 can be a Balun transformer module. Each of the first differential signals outputted from the transformer module 10 includes a common error and a differential error when the transformer module 10 is non-ideal.

The mixer module 11 includes a mixer 11a and a local oscillator 11b. The mixer 11a includes differential input terminals for receiving the first differential signals, control terminals for receiving a local oscillator frequency signal, and differential output terminals for outputting the second differential signals. The mixer 11a can be of any type, such as a passive mixer. The local oscillator 11b is coupled to the control terminals of the mixer 11a for generating a local oscillator frequency signal. For example, the local oscillator frequency signal can be generated at a frequency around 60 GHz. However, the receiver front-end system 100 is not limited to using the frequency of around 60 GHz. Any reasonable local oscillator (LO) frequency used for the receiver front-end system 100 falls into the scope of the present invention.

The amplifier module 13 includes a first amplifier 13a, a first resistor-capacitor circuit 13b, and a second resistor-capacitor circuit 13c. The first amplifier 13a is coupled to the common-mode feedback module 12 for amplifying the third differential signals. The first resistor-capacitor circuit 13b is coupled to the first amplifier 13a for adjusting a first amplification factor of one of the third differential signals. The second resistor-capacitor circuit 13c is coupled to the first amplifier 13a for adjusting a second amplification factor of the other one of the third differential signals. Specifically, the first amplifier 13a can be a differential amplifier. The first resistor-capacitor circuit 13b can include at least one resistor and at least one capacitor coupled in parallel. Similarly, the second resistor-capacitor circuit 13c can include at least one resistor and at least one capacitor coupled in parallel. The first amplification factor with respect to the first resistor-capacitor circuit 13b and the second amplification factor with respect to the second resistor-capacitor circuit 13c can be identical.

The common-mode feedback module 12 includes an error feedback circuit 12a, a first adder 12b, and a second adder 12c. The error feedback circuit 12a is coupled to the amplifier module 13 for detecting and amplifying the common error of the second differential signals initially. Then, the amplifier module 13 can be used for detecting and amplifying a common error of the third differential signals received by the amplifier module 13. The first adder 12b is coupled to the error feedback circuit 12a and the mixer module 11 for combining one of the second differential signals with one output signal of the error feedback circuit 12a in order to generate one of the third differential signals. The second adder 12c is coupled to the error feedback circuit 12a and the mixer module 11 for combining the other one of the second differential signals with the other output signal of the error feedback circuit 12a in order to generate the other one of the third differential signals. In other words, the error feedback circuit 12a, the first adder 12b, and the second adder 12c form a closed loop common error cancellation circuit for eliminating common error from the second differential signals to generate the third differential signals with the stable and controllable common signal.

Figure 3:
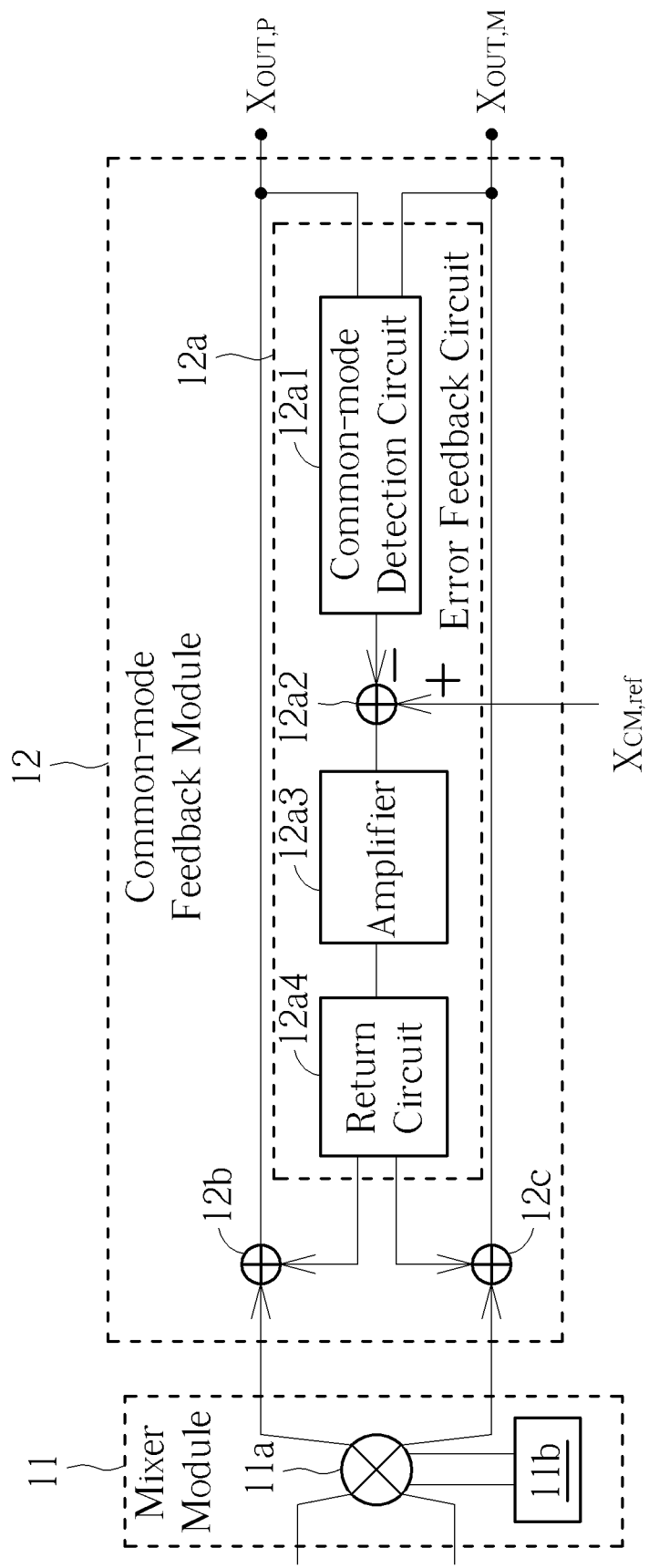
FIG. 3 shows a structure of an error feedback circuit of the common-mode feedback module of the receiver front-end system in FIG. 1.

FIG. 3 shows a structure of the error feedback circuit 12a of the common-mode feedback module 12 of the receiver front-end system 100. The error feedback circuit 12a includes a common-mode detection circuit 12a1, a third adder 12a2, a second amplifier 12a3, and a return circuit 12a4. The common-mode detection circuit 12a1 is coupled to the amplifier module 13 for detecting a common error of the third differential signals. The third adder 12a2 is coupled to the common-mode detection circuit 12a1 for combining the common error of the third differential signals with the reference signal $V_{CM,ref}$. For example, the third differential signals can be denoted as $X_{OUT,P}$ and $X_{OUT,M}$ with different phases and bearing the common error. The common-mode detection circuit 12a1 can output a signal as $(X_{OUT,P}+X_{OUT,M})/2$. The third adder 12a2 can combine the reference signal $V_{CM,ref}$ with the signal $(X_{OUT,P}+X_{OUT,M})/2$ with an inversed phase. Therefore, the third adder 12a2 can output a signal as $V_{CM,ref}-(X_{OUT,P}+X_{OUT,M})/2$. The second amplifier 12a3 is coupled to the third adder 12a2 for amplifying the output signal of the third adder 12a2. The return circuit 12a4 is coupled to the second amplifier 12a3, the first adder 12b and the second adder 12c for generating differential feedback signals according to the output signal of the second amplifier 12a3. Here, the third adder 12a2 and the second amplifier 12a3 can be integrated as a differential amplifier. The common-mode detection circuit 12a1 and the return circuit 12a4 can be replaced with any alternating current (AC) filtering circuit for improving direct current (DC) conductivity. Any reasonable hardware modification falls into the scope of the present invention.

Figure 4:
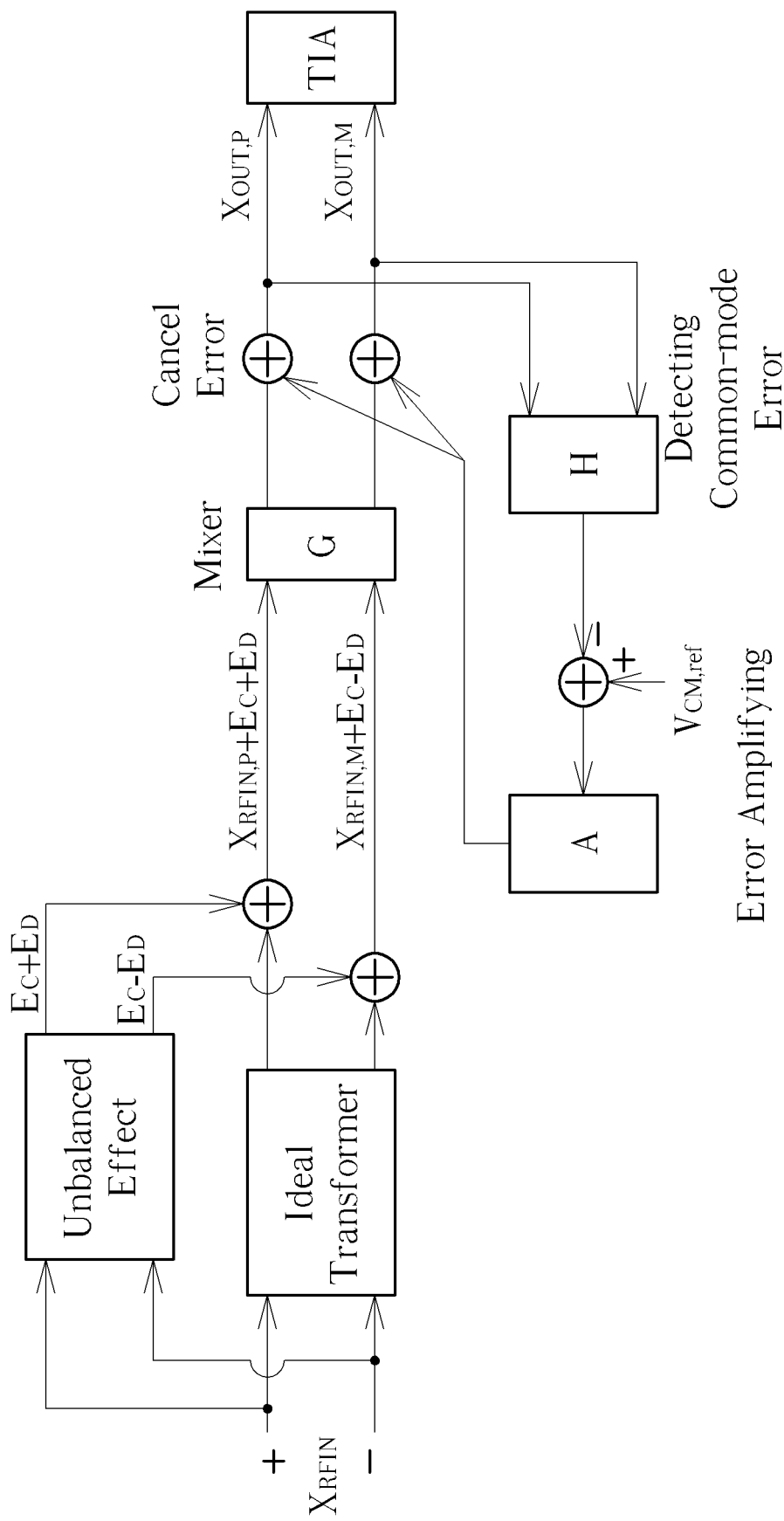
FIG. 4 is a mathematical model of the receiver front-end system in FIG. 1.

FIG. 4 is a mathematical model of the receiver front-end system 100. As previously mentioned, the "non-ideal" transformer module 10 is introduced to the front-end system 100. In the mathematical model, the "non-ideal" transformer module 10 can be modeled as an ideal transformer with an unbalanced effect. As previously mentioned, when the transformer module 10 is ideal, the radio frequency signal $X_{RFIN}$ received by the antenna Rx can be converted to differential signals $X_{RFIN,P}$ and $X_{RFIN,M}$ with different phases. When the transformer module 10 is non-ideal, the common error $E_C$ and a differential error $E_D$ are introduced. As a result, error terms of the differential signals can be modeled as $E_C+E_D$ and $E_C-E_D$. In other words, the first differential signals outputted from the transformer module 10 can be written as $$X_{RFIN,P}+E_C+E_D$$

$$X_{RFIN,M}+E_C-E_D$$

The common error $E_C$ can be regarded as an unexpectable offset of the first differential signals. The differential error $E_D$ can be regarded as an unexpectable gap variation between the first differential signals. The common error $E_C$ and the differential error $E_D$ are varied. Further, the first differential signals are processed by the mixer module 11 with a gain G to generate the second differential signals. Therefore, the second differential signals outputted from the mixer module 11 with the gain G can be written as $$G \times (X_{RFIN,P}+E_C+E_D)$$

$$G \times (X_{RFIN,M}+E_C-E_D)$$

Equivalently, the second differential signals outputted from the mixer module 11 introduce a common error $G \times E_C$ and a differential error gap $2 \times G \times E_D$. As previously mentioned, the common-mode feedback module 12 can be regarded as a common error cancellation circuit for eliminating common error from the second differential signals to generate the third differential signals. In the common-mode feedback module 12, a gain of the common-mode detection circuit 12a1 can be denoted as H. An amplification factor of the second amplifier 12a3 can be denoted as A. The reference signal is denoted as $V_{CM,ref}$. The third differential signals are denoted as $X_{OUT,P}$ and $X_{OUT,M}$. A signal outputted from the second amplifier 12a3 can be written as $$\Delta = A \times \{V_{CM,ref} - H \times (X_{OUT,P}+X_{OUT,M})\}$$

Since the feedback module 12 is the closed loop common error cancellation circuit, when the signal outputted from the second amplifier 12a3 is split by the return circuit 12a4 for combining with the second differential signals to generate the third differential signals $X_{OUT,P}$ and $X_{OUT,M}$, the third differential signals $X_{OUT,P}$ and $X_{OUT,M}$ can be written as $$X_{OUT,P} = G \times \left(X_{RFIN,P} + \frac{E_C}{1+A \times H} + E_D\right) + \left(\frac{A}{1+A \times H}\right) \times V_{CM,ref}$$

$$X_{OUT,M} = G \times \left(X_{RFIN,M} + \frac{E_C}{1+A \times H} - E_D\right) + \left(\frac{A}{1+A \times H}\right) \times V_{CM,ref}$$

Here, in one of the third differential signals (i.e., $X_{OUT,P}$), when the amplification factor A of the second amplifier 12a3 is very large, a term of common error $E_C/(1+A \times H)$ approaches to zero. A term of common signal of the one of the third differential signal (i.e., $X_{OUT,P}$) approaches to $(1/H) \times V_{CM,ref}$. Similarly, in the other one of the third differential signals (i.e., $X_{OUT,M}$), when the amplification factor A of the second amplifier 12a3 is very large, a term of common error $E_C/(1+A \times H)$ approaches to zero. A term of common signal of the other one of the third differential signal (i.e., $X_{OUT,M}$) approaches to $(1/H) \times V_{CM,ref}$. Specifically, since the (1/H) is a constant and the reference signal $V_{CM,ref}$ is controllable, the common-mode feedback module 12 can be regarded as the common error cancellation circuit for eliminating the common error $E_C$ from the second differential signals to generate the third differential signals with a stable and controllable common signal. In a case of using the return circuit 12a4 with an appropriate gain, the gain H can be normalized so that the common signal of the third differential signals (i.e., $X_{OUT,P}$ and $X_{OUT,M}$) can be controlled to approach reference signal $V_{CM,ref}$ when the amplification factor A is very large. By doing so, the unexpectable unbalanced effect introduced to the front-end system 100 can be mitigated.

Figure 5:
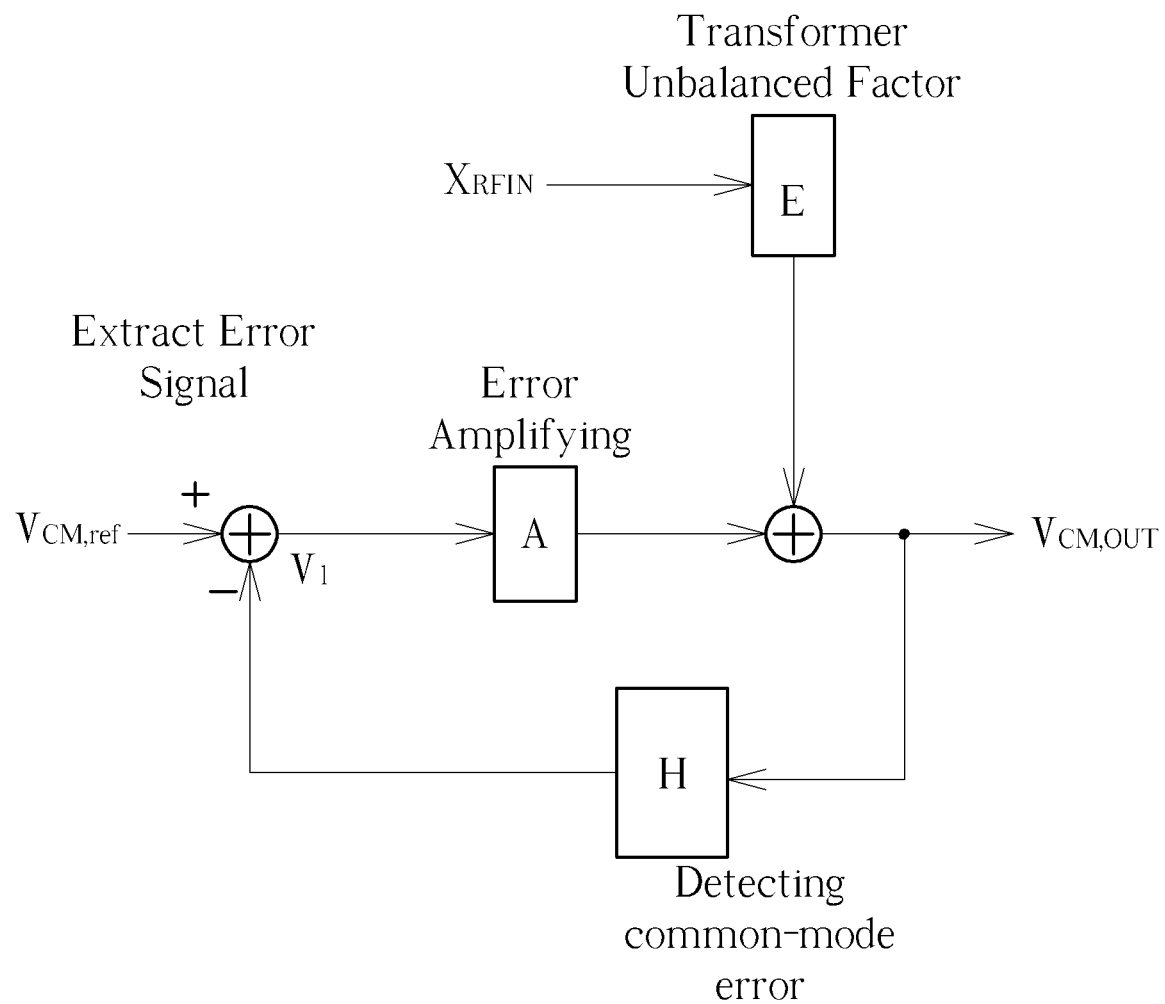
FIG. 5 is a mathematical model of generating an output common signal from a reference signal of the receiver front-end system in FIG. 1.

FIG. 5 is a mathematical model of generating an output common signal $V_{CM,OUT}$ from the reference signal $V_{CM,ref}$ of the receiver front-end system 100. To further analyze signal conversion of the output common signal $V_{CM,OUT}$ from the reference signal $V_{CM,ref}$ through the common-mode feedback module 12, the mathematical model of generating the output common signal $V_{CM,OUT}$ from the reference signal $V_{CM,ref}$ is illustrated below. As previously mentioned, the common-mode feedback module 12 can be regarded as the closed-loop common error cancellation circuit. The transformer module 10 is non-ideal so that the radio frequency signal $X_{RFIN}$ is distorted by a transformer unbalanced factor E (i.e., linear or non-linear signal distortion caused by introducing the common error $E_C$ and the differential error $E_D$). After the radio frequency signal $X_{RFIN}$ is distorted, equivalently, the distorted radio frequency signal can be denoted as $X_{RFIN} \times E$. Here, E can be regarded as a general distortion function. Based on the structure in FIG. 3, the mathematical model of the common-mode feedback module 12 for the reference signal $V_{CM,ref}$ can be illustrated in FIG. 5. A is the amplification factor of the second amplifier 12a3. H is the gain of the common-mode detection circuit 12a1. In FIG. 5, the output common signal $V_{CM,OUT}$ can be written as $$V_{CM,OUT}=(A \times V_1)+(X_{RFIN} \times E).$$

Here, $V_1$ is denoted as an output signal of the third adder 12a2. The output signal $V_1$ of the third adder 12a2 can be written as $$V_1=V_{CM,ref}-V_{CM,OUT} \times H.$$

Therefore, substituting $V_1$ into $V_{CM,OUT}=(A \times V_1)+(X_{RFIN} \times E)$ results in $$V_{CM,OUT} = A \times (V_{CM,ref} - V_{CM,OUT} \times H) + (X_{RFIN} \times E)$$
$$= A \times V_{CM,ref} - A \times V_{CM,OUT} \times H + X_{RFIN} \times E$$

Therefore, the output common signal $V_{CM,OUT}$ can be written as $$V_{CM,OUT} = \left(\frac{A}{1+A \times H}\right) \times V_{CM,ref} + \left(\frac{1}{1+A \times H}\right) \times (X_{RFIN} \times E)$$

Here, when the amplification factor A of the second amplifier 12a3 is very large, a term of the radio frequency signal $[1/(1+A\times H)]\times X_{RFIN}\times E$ approaches to zero. A term of reference signal $[A/(1+A\times H)]\times V_{CM,ref}$ approaches to $(1/H)\times V_{CM,ref}$. It implies that the output common signal $V_{CM,OUT}$ is irrelevant to the distorted radio frequency signal $X_{RFIN}\times E$. The output common signal $V_{CM,OUT}$ approaches to $(1/H)\times V_{CM,ref}$ when the amplification factor A is very large. Since the (1/H) is a constant and the reference signal $V_{CM,ref}$ is controllable, the common-mode feedback module 12 can be regarded as the common error cancellation circuit for controlling output common signal $V_{CM,OUT}$. A mathematical derivation result of FIG. 5 corresponds to the mathematical derivation result of FIG. 4. By doing so, the unexpectable unbalanced effect introduced to the front-end system 100 can be mitigated.

Figure 6:
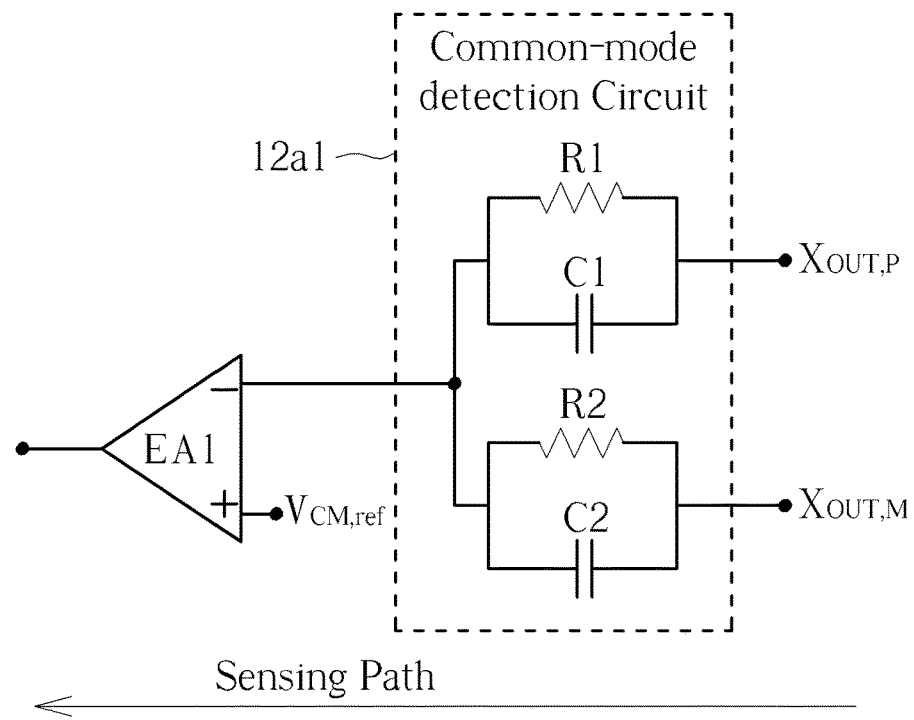
FIG. 6 is a structure of a common-mode detection circuit of the receiver front-end system in FIG. 1.

FIG. 6 is a structure of the common-mode detection circuit 12a1 of the receiver front-end system 100. The common-mode detection circuit 12a1 includes a first resistor R1, a first capacitor C1, a second resistor R2, and a second capacitor C2. The first resistor R1 includes a first terminal, and a second terminal coupled to the amplifier module 13 for receiving one of the third differential signals (i.e., $X_{OUT,P}$). The first capacitor C1 includes a first terminal couple to the first terminal of the first resistor R1, and a second terminal coupled to second terminal of the first resistor R1. The second resistor R2 includes a first terminal coupled to the first terminal of the first resistor R1, and a second terminal coupled to the amplifier module 13 for receiving the other one of the third differential signals (i.e., $X_{OUT,M}$). The second capacitor C2 includes a first terminal couple to the first terminal of the second resistor R2, and a second terminal coupled to second terminal of the second resistor R2. In FIG. 6, the first resistor R1 and the first capacitor C1 from a resistor-capacitor circuit for filtering AC component from $X_{OUT,P}$ for improving DC conductivity. Similarly, the second resistor R2 and the second capacitor C2 form a resistor-capacitor circuit for filtering AC component from $X_{OUT,M}$ for improving DC conductivity. Further, the third adder 12a2 and the second amplifier 12a3 in FIG. 3 can be integrated as a differential amplifier EA1 in FIG. 5. In other words, the differential amplifier EA1 receives an output signal of the common-mode detection circuit 12a1 and the reference signal $V_{CM,ref}$. Therefore, the differential amplifier EA1 can output a signal as $V_{CM,ref}-(X_{OUT,P}+X_{OUT,M})/2$.

However, the common-mode detection circuit 12a1 can be implemented as any reasonable hardware circuit. For example, the current bias circuit can be applied to the common-mode detection circuit 12a1 for outputting a signal as $V_{CM,ref}-(X_{OUT,P}+X_{OUT,M})/2$ by adjusting each current proportion of the reference signal $V_{CM,ref}$ and the third differential signals ($X_{OUT,P}$ and $X_{OUT,M}$). Any reasonable hardware circuit of the common-mode detection circuit 12a1 falls into the scope of the present invention.

Figure 7:
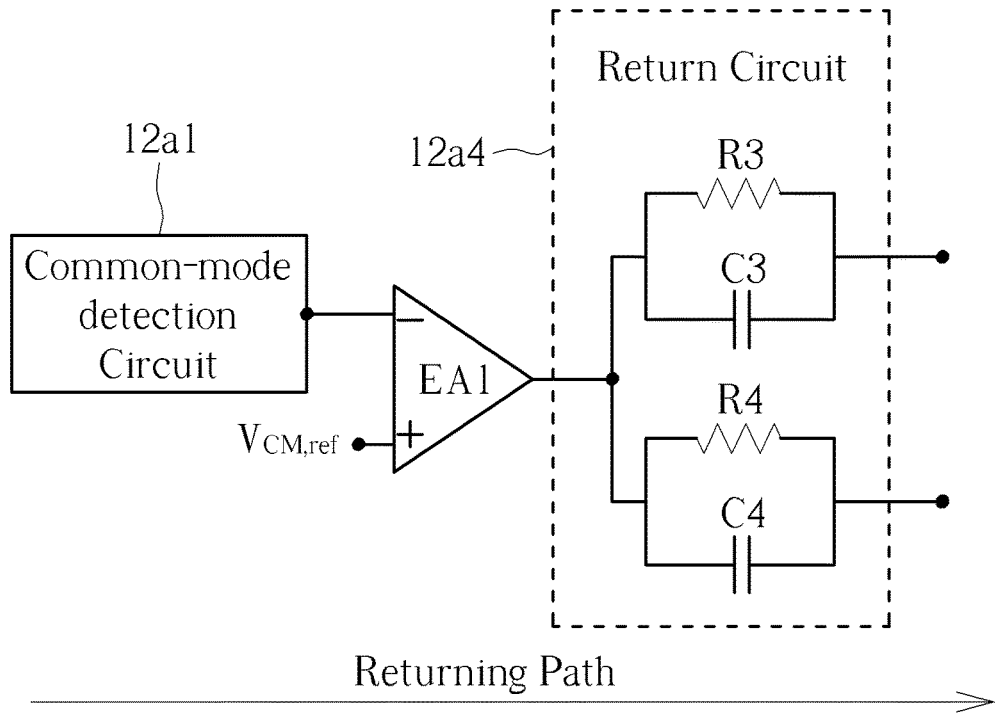
FIG. 7 is a structure of a return circuit of the receiver front-end system in FIG. 1.

FIG. 7 is a structure of the return circuit 12a4 of the receiver front-end system 100. The return circuit 12a4 includes a third resistor R3, a third capacitor C3, a fourth resistor R4, and a fourth capacitor C4. The third resistor R3 includes a first terminal for receiving the output signal of the differential amplifier EA1, and a second terminal coupled to the first adder 12b (in FIG. 2). The third capacitor C3 includes a first terminal couple to the first terminal of the third resistor R3, and a second terminal coupled to second terminal of the third resistor R3. The fourth resistor R4 includes a first terminal coupled to the first terminal of the third resistor R3, and a second terminal coupled to the second adder 12c (in FIG. 2). The fourth capacitor C4 includes a first terminal couple to the first terminal of the fourth resistor R4, and a second terminal coupled to second terminal of the fourth resistor R4. Therefore, the output signal of the differential amplifier EA1 can be split to two DC signals and then received by the first adder 12b and the second adder 12c (in FIG. 2) through the return circuit 12a4. For example, when the third resistor R3 and the fourth resistor R4 are identical, and the third capacitor C3 and the fourth capacitor C4 are identical, the output signal of the differential amplifier EA1 can be split to two identical DC signals for eliminating the common error of the second differential signals through the first adder 12b and the second adder 12c.

In FIG. 6 and FIG. 7, the common-mode detection circuit 12a1, the differential amplifier EA1, and the return circuit 12a4 can detect and then amplify the common error to generate an amplified common error with an opposite phase, and return the amplified common error with the opposite phase to the second differential signals in order to eliminate the common error of the second differential signals. By doing so, after the common error of the second differential signals is eliminated, the common signal of the third differential signals approaches to the reference signal $V_{CM,ref}$ if the common error is amplified with a very large amplification factor. Further, since the reference signal $V_{CM,ref}$ is controllable, the reference signal $V_{CM,ref}$ can be adjusted so as to process the third differential signals by the amplifier module 13 within a linear operation region. Therefore, linearity of the receiver front-end system 100 can be enhanced.

Figure 8:
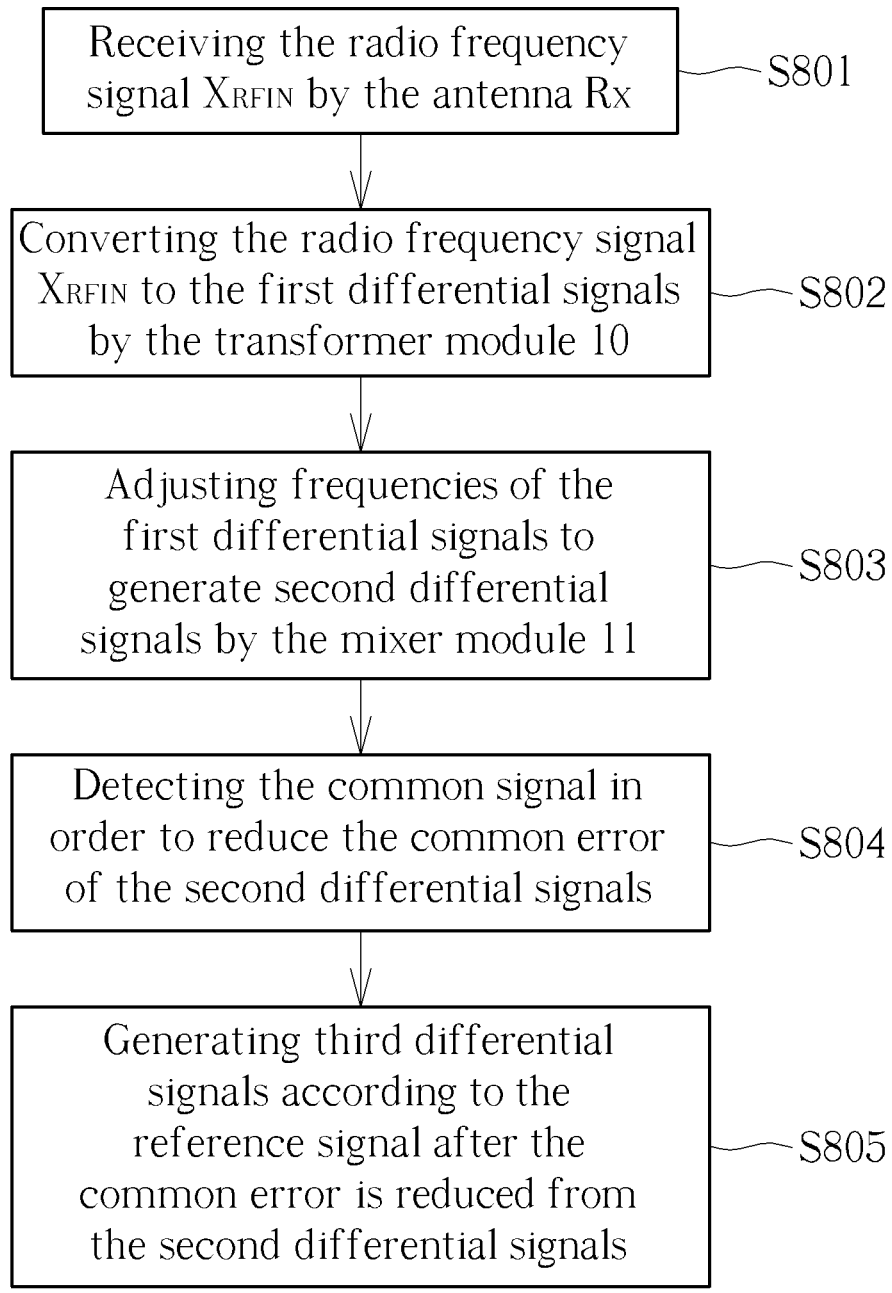
FIG. 8 is a flow chart of a method for enhancing linearity of the receiver front-end system in FIG. 1.

FIG. 8 is a flow chart of a method for enhancing linearity of the receiver front-end system 100. The method for enhancing linearity of the receiver front-end system 100 includes step S801 to step S805. Any reasonable technology modification of step S801 to step S805 falls into the scope of the present invention. Step S801 to step S805 are illustrated below.

step S801: receiving the radio frequency signal $X_{RFIN}$ by the antenna Rx;

step S802: converting the radio frequency signal $X_{RFIN}$ to the first differential signals by the transformer module 10;

step S803: adjusting frequencies of the first differential signals to generate second differential signals by the mixer module 11;

step S804: detecting the common signal in order to reduce the common error of the second differential signals;

step S805: generating third differential signals according to the reference signal after the common error is reduced from the second differential signals.

Step S801 to step S805 are illustrated previously. Thus, their illustrations are omitted here. By processing step S801 to step S805, linearity degradation of the receiver front-end system 100 can be mitigated since a common-mode feedback path is designed for compensating (or say, eliminating)

the common-mode error. Therefore, even if the transformer module 10 of the receiver front-end system 100 is non-ideal, the linearity of the receiver front-end system 100 can be enhanced.

To sum up, the present invention discloses a receiver front-end system and a method for enhancing linearity of the receiver front-end system by using a common-mode feedback process. Without loss of generality, a non-ideal transformer module is introduced to convert a radio frequency signal to unbalanced differential signals with a common error. To eliminate an unbalanced effect (or say, a common signal distortion caused by introducing the common error), a common-mode feedback module is used for providing a common-mode feedback path for eliminating the common-mode error. The common-mode feedback module can be regarded as a closed loop common error cancellation circuit for eliminating the common error to output the differential signals with a stable and controllable common signal. The common signal of the outputted differential signals can be adjusted according to the reference signal. Since the common signal of the outputted differential signals is controllable, the common signal can be appropriately adjusted so as to process the outputted differential signals by the amplifier module or other circuit components within their linear operation region. Thus, linearity of the receiver front-end system can be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver front-end system comprising:
an antenna configured to receive a radio frequency signal;
a transformer module coupled to the antenna and configured to convert the radio frequency signal to first differential signals;
a mixer module coupled to the transformer module and configured to adjust frequencies of the first differential signals in order to generate second differential signals;
a common-mode feedback module coupled to the mixer module and configured to reduce a common error of the second differential signals in order to generate third differential signals according to a reference signal, the common-mode feedback module comprising:
an error feedback circuit coupled to an amplifier module and configured to detect and amplify the common error, the error feedback circuit comprising:
a common-mode detection circuit coupled to the amplifier module and configured to detect a common error of the third differential signals;
a third adder coupled to the common-mode detection circuit and configured to combine the common error of the third differential signals with the reference signal;
a second amplifier coupled to the third adder and configured to amplify an output signal of the third adder; and
a return circuit coupled to the second amplifier, the first adder and the second adder and configured to generate differential feedback signals according to an output signal of the second amplifier;
a first adder coupled to the error feedback circuit and the mixer module and configured to combine one of the second differential signals with one output signal of the error feedback circuit in order to generate one of the third differential signals; and
a second adder coupled to the error feedback circuit and the mixer module and configured to combine another one of the second differential signals with another one output signal of the error feedback circuit in order to generate another one of the third differential signals;
the amplifier module coupled to the common-mode feedback module and configured to amplify the third differential signals to generate amplified third differential signals; and
a bias module coupled to the amplifier module and the common-mode feedback module and configured to generate the reference signal to the common-mode feedback module according to the amplified third differential signals;
wherein the first differential signals, the second differential signals, and the third differential signals are unbalanced, a common signal of the first differential signals is disturbed by the common error, and a common signal of the third differential signals approaches to the reference signal, the third differential signals are)

$$X_{OUT,P}=G1\times\{X_{RFIN,P}+[E_C/(1+A\times H)]+E_D\}+[A/(1+A\times H)]\times V_{CM,ref}; \text{ and}$$

$$X_{OUT,M}=G1\times\{X_{RFIN,M}+[E_C/(1+A\times H)]-E_D\}+[A/(1+A\times H)]\times V_{CM,ref}; \text{ and}$$

wherein G1 is a gain of the mixer module, $X_{RFIN,P}$ and $X_{RFIN,M}$ are differential input signals converted from the radio frequency signal, $E_C$ is the common error of the second differential signals, A is an amplification factor of the second amplifier, H is a gain of the common-mode detection circuit, $E_D$ is a differential error from the second differential signals, and $V_{CM,ref}$ is the reference signal.

2. The system of claim 1, wherein the transformer module comprises:
an impedance matching network coupled to the antenna and configured to maximize power transfer of the radio frequency signal by matching impedance of an equivalent electrical load; and
a transformer coupled to the impedance matching network and configured to output the first differential signals.

3. The system of claim 1, wherein the mixer module comprises:
a mixer comprising:
differential input terminals configured to receive the first differential signals;
control terminals configured to receive a local oscillator frequency signal; and
differential output terminals configured to output the second differential signals; and
a local oscillator coupled to the control terminals of the mixer and configured to generate the local oscillator frequency signal.

4. The system of claim 3, wherein the mixer is a passive mixer, and the local oscillator generates the local oscillator frequency signal at a frequency of around 60 G Hertz.

5. The system of claim 1, wherein the amplifier module comprises:
a first amplifier coupled to the common-mode feedback module and configured to amplify the third differential signals;
a first resistor-capacitor circuit coupled to the first amplifier and configured to adjust a first amplification factor of one of the third differential signals; and a second resistor-capacitor circuit coupled to the first amplifier and configured to adjust a second amplification factor of another one of the third differential signals.

6. The system of claim 5, wherein the first amplifier is a differential amplifier, the first resistor-capacitor circuit comprises at least one resistor and at least one capacitor coupled in parallel, and the second resistor-capacitor circuit comprises at least one resistor and at least one capacitor coupled in parallel.

7. The system of claim 1, wherein the amplifier module is a transimpedance amplifier (TIA) module configured to perform a current-to-voltage amplification operation of the third differential signals in order to output voltage-based differential signals with respect to amplification factors.

8. The system of claim 1, wherein the common-mode detection circuit comprises:
a first resistor comprising:
a first terminal; and
a second terminal coupled to the amplifier module and configured to receive one of the third differential signals;
a first capacitor comprising:
a first terminal couple to the first terminal of the first resistor;
a second terminal coupled to second terminal of the first resistor;
a second resistor comprising:
a first terminal coupled to the first terminal of the first resistor; and
a second terminal coupled to the amplifier module and configured to receive another one of the third differential signals; and
a second capacitor comprising:
a first terminal couple to the first terminal of the second resistor; and
a second terminal coupled to second terminal of the second resistor.

9. The system of claim 1, wherein the return circuit comprises:
a third resistor comprising:
a first terminal configured to receive the output signal of the second amplifier; and
a second terminal coupled to the first adder;
a third capacitor comprising:
a first terminal couple to the first terminal of the third resistor;
a second terminal coupled to second terminal of the third resistor;
a fourth resistor comprising:
a first terminal coupled to the first terminal of the third resistor; and
a second terminal coupled to the second adder; and
a fourth capacitor comprising:
a first terminal couple to the first terminal of the fourth resistor; and
a second terminal coupled to second terminal of the fourth resistor.

10. The system of claim 1, wherein the transformer module is a Balun transformer, each of the first differential signals outputted from the transformer module comprises a common error and a differential error when the transformer module is non-ideal.

11. A receiver front-end system comprising:
an antenna configured to receive a radio frequency signal;
a transformer module coupled to the antenna and configured to convert the radio frequency signal to first differential signals;
a mixer module coupled to the transformer module and configured to adjust frequencies of the first differential signals in order to generate second differential signals;
a common-mode feedback module coupled to the mixer module and configured to reduce a common error of the second differential signals in order to generate third differential signals according to a reference signal, the common-mode feedback module comprising:
an error feedback circuit coupled to an amplifier module and configured to detect and amplify the common error, the error feedback circuit comprising:
a common-mode detection circuit coupled to the amplifier module and configured to detect a common error of the third differential signals;
a third adder coupled to the common-mode detection circuit and configured to combine the common error of the third differential signals with the reference signal;
a second amplifier coupled to the third adder and configured to amplify an output signal of the third adder; and
a return circuit coupled to the second amplifier, the first adder and the second adder and configured to generate differential feedback signals according to an output signal of the second amplifier;
a first adder coupled to the error feedback circuit and the mixer module and configured to combine one of the second differential signals with one output signal of the error feedback circuit in order to generate one of the third differential signals; and
a second adder coupled to the error feedback circuit and the mixer module and configured to combine another one of the second differential signals with another one output signal of the error feedback circuit in order to generate another one of the third differential signals;
the amplifier module coupled to the common-mode feedback module and configured to amplify the third differential signals to generate amplified third differential signals; and
a bias module coupled to the amplifier module and the common-mode feedback module and configured to generate the reference signal to the common-mode feedback module according to the amplified third differential signals;
wherein the first differential signals, the second differential signals, and the third differential signals are unbalanced, a common signal of the first differential signals is disturbed by the common error, and a common signal of the third differential signals approaches to the reference signal, the common signal of the third differential signals is $$V_{CM,OUT} = [A/(1+A \times H)] \times V_{CM,ref} + [1/(1+A \times H)] \times X_{RFIN} \times E; \text{ and}$$

wherein A is an amplification factor of the second amplifier, H is a gain of the common-mode detection circuit, $V_{CM,ref}$ is the reference signal, $X_{RFIN}$ is the radio frequency signal, and E is an unbalanced factor of the transformer.

12. A method for enhancing linearity of a receiver front-end system comprising:
receiving a radio frequency signal by an antenna;

converting the radio frequency signal to first differential signals by a transformer module;

adjusting frequencies of the first differential signals to generate second differential signals by a mixer module;

detecting a common signal in order to reduce a common error of the second differential signals by a common-mode feedback module; and generating third differential signals according to a reference signal after the common error is reduced from the second differential signals;

wherein the first differential signals, the second differential signals, and the third differential signals are unbalanced, the third differential signals are $$X_{OUT,P}=G1\times\{X_{RFIN,P}+[E_C/(1+A\times H)]+E_D\}+[A/(1+A\times H)]\times V_{CM,ref};\text{ and}$$

$$X_{OUT,M}=G1\times\{X_{RFIN,M}+[E_C/(1+A\times H)]-E_D\}+[A/(1+A\times H)]\times V_{CM,ref};\text{ and}$$

wherein G1 is a gain of the mixer module, $X_{RFIN,P}$ and $X_{RFIN,M}$ are differential input signals converted from the radio frequency signal, $E_C$ is the common error of the second differential signals, A is an amplification factor of a second amplifier of the common-mode feedback module, H is a gain of a common-mode detection circuit of the common-mode feedback module, $E_D$ is a differential error from the second differential signals, and $V_{CM,ref}$ is the reference signal.

13. The method of claim 12, further comprising:

amplifying the common error to generate an amplified common error with an opposite phase; and returning the amplified common error with the opposite phase to the second differential signals in order to eliminate the common error of the second differential signals.

14. The method of claim 13, wherein after the common error of the second differential signals is eliminated, a common signal of the third differential signals approaches to the reference signal if the common error is amplified with a large amplification factor.

15. The method of claim 12, further comprising:

adjusting the reference signal so as to process the third differential signals by an amplifier module within a linear operation region.

16. The method of claim 12, wherein the transformer module is a Balun transformer, each of the first differential signals outputted from the transformer module comprises a common error and a differential error when the transformer module is non-ideal.

17. The method of claim 12, further comprising:

maximizing power transfer of the radio frequency signal by matching impedance of an equivalent electrical load of the receiver front-end system.

18. A method for enhancing linearity of a receiver front-end system comprising:

receiving a radio frequency signal by an antenna;

converting the radio frequency signal to first differential signals by a transformer module;

adjusting frequencies of the first differential signals to generate second differential signals by a mixer module;

detecting a common signal in order to reduce a common error of the second differential signals by a common-mode feedback module; and generating third differential signals according to a reference signal after the common error is reduced from the second differential signals;

wherein the first differential signals, the second differential signals, and the third differential signals are unbalanced, the common signal of the third differential signals is $$V_{CM,OUT}=[A/(1+A\times H)]\times V_{CM,ref}+[1/(1+A\times H)]\times X_{RFIN}\times E;\text{ and}$$

wherein A is an amplification factor of a second amplifier of the common-mode feedback module, H is a gain of the common-mode detection circuit of the common-mode feedback module, $V_{CM,ref}$ is the reference signal, $X_{RFIN}$ is the radio frequency signal, and E is an unbalanced factor of the transformer module.

* * * * *